United States Patent
Stokes

(10) Patent No.: US 6,856,499 B2
(45) Date of Patent: Feb. 15, 2005

(54) MEMS VARIABLE INDUCTOR AND CAPACITOR

(75) Inventor: Robert B. Stokes, Rancho Palos Verdes, CA (US)

(73) Assignee: Northrop Gurmman Corporation, Los Angeles, CA (US)

(*) Notice: Subject to any disclaimer, the term of this patent is extended or adjusted under 35 U.S.C. 154(b) by 0 days.

(21) Appl. No.: 10/402,032

(22) Filed: Mar. 28, 2003

(65) Prior Publication Data

US 2004/0190217 A1 Sep. 30, 2004

(51) Int. Cl.⁷ .................................................. H01G 7/00
(52) U.S. Cl. ...................... 361/277; 361/278; 361/280; 361/292; 361/294; 361/299.1
(58) Field of Search ................................ 361/277, 278, 361/279, 280, 283.2, 283.3, 290, 291, 292, 296, 299.1, 271, 272

(56) References Cited

U.S. PATENT DOCUMENTS

| | | | |
|---|---|---|---|
| 1,616,102 A | | 2/1927 | Anderson |
| 5,901,031 A | * | 5/1999 | Ishige et al. ................. 361/277 |
| 5,929,542 A | * | 7/1999 | Ohnstein et al. ...... 310/40 MM |
| 6,101,371 A | | 8/2000 | Barber et al. |
| 6,218,911 B1 | | 4/2001 | Kong et al. |
| 6,229,684 B1 | | 5/2001 | Cowen et al. |
| 6,236,491 B1 | * | 5/2001 | Goodwin-Johansson .... 359/291 |
| 6,242,989 B1 | | 6/2001 | Barber et al. |
| 6,373,682 B1 | | 4/2002 | Goodwin-Johansson |
| 6,377,438 B1 | | 4/2002 | Deane et al. |
| 6,396,677 B1 | | 5/2002 | Chua et al. |
| 6,404,304 B1 | | 6/2002 | Kwon et al. |
| 6,437,965 B1 | * | 8/2002 | Adkins et al. ............... 361/303 |
| 6,556,415 B1 | * | 4/2003 | Lee et al. .................... 361/277 |

FOREIGN PATENT DOCUMENTS

| | | |
|---|---|---|
| DE | 881 389 C | 6/1953 |
| DE | 969 214 C | 5/1958 |
| GB | 148679 | 8/1920 |

\* cited by examiner

*Primary Examiner*—Dean A. Reichard
*Assistant Examiner*—Nguyen T. Ha
(74) *Attorney, Agent, or Firm*—Tarolli, Sundheim, Covell & Tummino L.L.P.

(57) ABSTRACT

A variable passive component is provided for fabrication on a microelectromechanical system (MEMS) device. A conductive portion is provided on a low-profile sliding dielectric sheet that cooperates with a conductive portion disposed on a substrate to provide a variable passive component. The passive component can be a variable inductor provided by moving a shorted spiral inductor formed on the dielectric sheet over a spiral inductor on the substrate with varying degrees of overlap causing varying inductance values. The passive component can be a variable capacitor that consists of a large conductive pad on a dielectric plate which slides over two adjacent pads on the substrate with varying overlap causing varying capacitance values.

30 Claims, 8 Drawing Sheets

MEMS VARIABLE INDUCTOR AND CAPACITOR

TECHNICAL FIELD

The present invention relates generally to electronic devices, and more particularly to variable electronic devices fabricated on a microelectromechanical system (MEMS) device.

BACKGROUND OF THE INVENTION

Monolithic implementation of adjustable linear passive components employing conventional fabrication methods has been impractical if not unrealizable due to the difficulty in fabrication and expense of fabrication of these components on an integrated circuit. Recently, the problems associated with the fabrication of these devices have been addressed by employing MEMS technology. MEMS technology is a process for fabricating various components using micromachining in a similar manner to fabricating integrated circuits (ICs). MEMS structures are typically capable of mechanical motion or force and can be integrated onto the same device structure with electronic devices that provide the stimulus and control of the mechanical structures. Many different variety of MEMS devices (e.g., microsensors, microgears, micromotors) have been fabricated employing MEMS technology. Additionally, variable passive devices (e.g., inductors, capacitors) can be fabricated employing MEMS technology as micron-sized electromechanical structures.

Electrostatic forces are employed to move structures by energizing one or more electrodes coupled to a movable structure and one or more electrodes coupled to a base structure. Electrically energizing the electrodes creates an electrostatic force that attracts the electrodes to one another, usually against a spring restoring force. A typical MEMS electrostatically variable capacitor includes two parallel plates in which a fixed plate is provided on a substrate and a movable plate is disposed above the fixed plate and is movable toward and away from the fixed plate. The distance between the two plates is variable and thus, determines the capacitance of the capacitor. Both plates are coupled to electrodes to generate the electrostatic forces that move the movable plate toward the fixed plate, balancing against a spring restoring force. A signal line is also coupled to the movable plate and the fixed plate which provides the electrical signal to the capacitor. The tuning range of the variable capacitor is limited by the distance over which the movable plate can be controlled. The change in distance between the movable plate and the fixed plate that can be achieved limits the dynamic range of the variable capacitor in addition to the capacitive values.

Attempts to provide variable inductors have been made employing MEMS structures. For example, the inductance of an inductor coil may be varied by moving a magnetic material axially into and out of the inductor coil. However, magnetic materials are not easily implemented in a MEMS device since most materials available have poor material permeability in addition to experiencing losses at high frequencies. Another mechanism for providing a variable inductor is to dispose a first coil within a second coil connected electrically in parallel and vary the inductance of the second coil by rotating the first coil on an axis disposed in the plane of the second coil. A rotatable motor or the like is necessary to rotate the first coil, which is complicated to implement in a MEMS device.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor delineate the scope of the invention. Its sole purpose is to present some concepts of the invention in a simplified form as a prelude to the more detailed description that is presented later.

The present invention relates to variable passive components that can be provided on a MEMS device. A first conductive portion is disposed on a generally planar top surface of a substrate. A second conductive portion is disposed on a movable plate that interacts with the first conductive portion to provide a variable passive component. The movable plate moves in a plane that is generally parallel to the top surface of the substrate, such that a gap is maintained between the first and second conductive portions. The amount or degree of overlap of the second conductive portion with respect to the first conductive portion determines the component value of the variable passive component. The component value of the variable passive component can be adjusted by varying the amount or degree of overlap. A linear actuator can be provided to move the second conductive portion in a generally parallel motion to provide the various overlapping positions. A linear actuator can be employed that moves the movable plate without direct electrical connections, so that connections to movable parts are mitigated.

In one aspect of the present invention, the passive component is a variable inductor provided by moving a shorted spiral inductor formed on the movable plate over a spiral inductor on the substrate with varying amounts of overlap causing varying inductance values. The degree of magnetic coupling associated with the amount of overlap determines the inductance value of the substrate inductor.

In another aspect of the present invention, the passive component is a variable capacitor that consists of a large conductive pad formed on the movable plate which slides over two adjacent pads on the substrate with varying amounts of overlap causing varying capacitance values. The amount of overlap determines the area of the electric field between overlapping portions of the movable conductive pad and the substrate pads and, thus the variable capacitance value.

In another aspect of the present invention, one or more variable capacitors and/or one or more variable inductors employing movable plate conductive components and substrate conductive components can be provided on a tunable filter fabricated on a MEMS device. The tunable filter can be employed in a variety of applications, such as a spectrum clean-up filter at the output of a digital synthesizer or a selective front-end filter in a receiver device.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF INVENTION

The present invention relates to variable passive components that can be provided on a MEMS device. The present invention employs a conductive portion on a low-profile sliding dielectric plate or sheet that cooperates with a conductive portion disposed on a substrate to provide a variable passive component. In one aspect of the present invention, the passive component is a variable inductor provided by moving a shorted spiral inductor formed on the dielectric sheet over a spiral inductor on the substrate with varying amounts of overlap causing varying inductance values. In another aspect of the present invention, the passive component is a variable capacitor that consists of a large conductive pad on a dielectric plate which slides over two adjacent pads on the substrate with varying amounts of overlap causing varying capacitance values.

The present invention employs a sliding in-plane MEMS motion to vary a passive component value (e.g., inductance or capacitance). The dielectric plate is driven by a linear actuator to alter the values of the passive component, in which no direct connections to any electrodes on the movable dielectric plate or sheet are employed. This eliminates the problem of making connection to a moving part. The present invention provides a larger range of adjustment with a wider range of values (e.g., 10:1, 20:1) for the variable component value than other MEMS variable components in addition to precise control of intermediate component values by adjustments in small increments.

Figure 1:
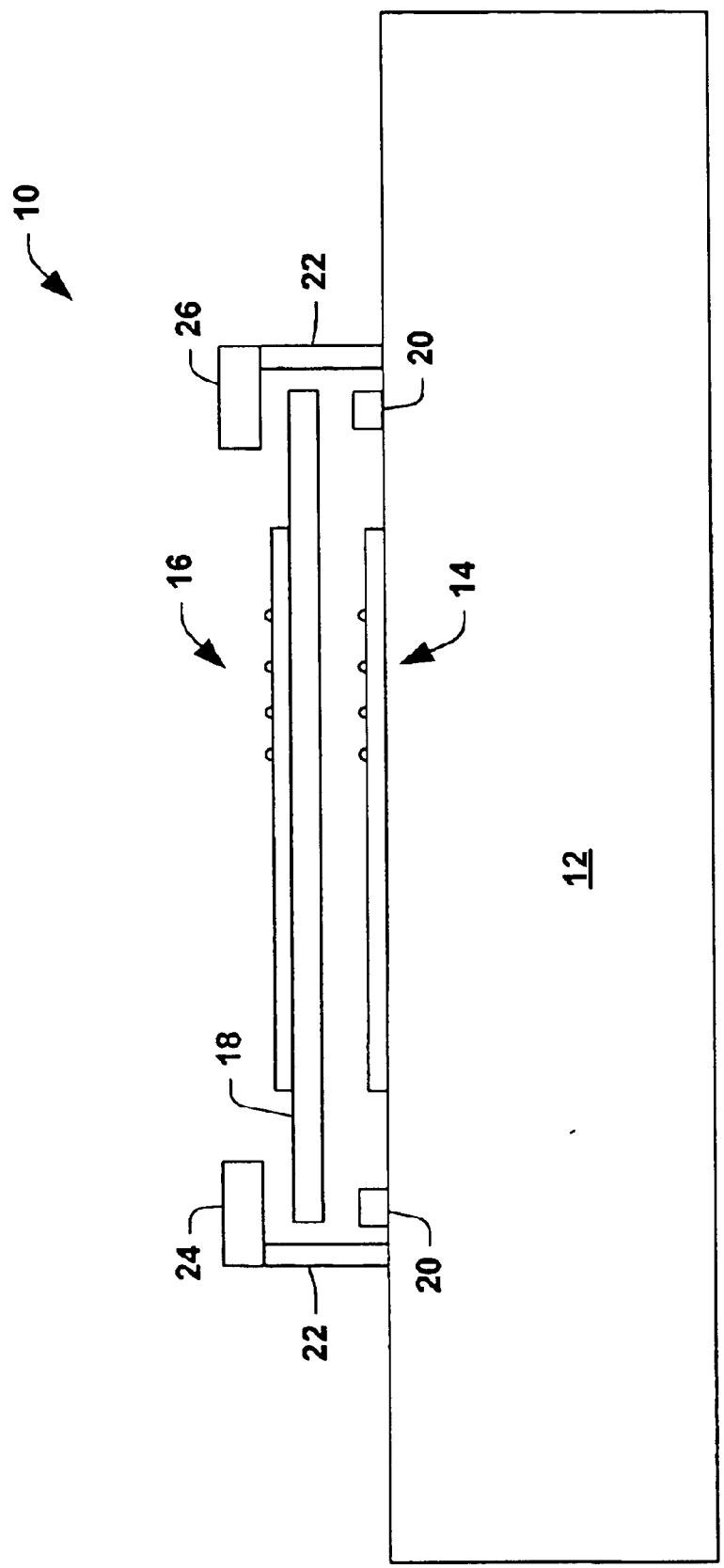
FIG. 1 illustrates a front view of a variable inductor MEMS device in accordance with an aspect of the present invention.

FIG. 1 illustrates a front view of a MEMS device 10 in accordance with an aspect of the present invention. The MEMS device 10 includes a passive electrical component formed of a first conductive portion 14 disposed on a substrate 12 and a second conductive portion 16 formed on a movable dielectric plate 18. The substrate 12 can be formed from a semiconductor material, such as silicon, gallium arsenide, or indium phosphide, or on an insulator such as quartz, glass, sapphire, alumina, or a circuit board material. The substrate 12 has a generally planar top surface and the dielectric plate 18 moves in a plane that is generally parallel to the planar top surface via a linear actuator (not shown). The dielectric plate 18 moves in a generally parallel relationship with the planar top surface to maintain a gap between the first conductive portion 14 and the second conductive portion 16. It is to be appreciated that the generally parallel movement can include perpendicular components as long as a gap is maintained between the first conductive portion 14 and the second conductive portion 16. The amount or degree of overlap of the second conductive portion 16 with respect to the first conductive portion 14 determines the component value of the passive electrical component.

The dielectric plate 18 is retained between a pair of side walls 22 and slides along a pair of rails 20 with keeper tabs 24 and 26 over the edges of the dielectric plate 18 to prevent it from leaving the rails 20. The side walls 22 hold the keeper tabs 24 and 26 and retain the linear motion of the dielectric plate 18. The dielectric plate 18 can be fabricated from a variety of different insulating materials (e.g., silicon dioxide, glass). The first conductive portion 14 and the second conductive portion 16 cooperate to provide a variable passive component (e.g., variable inductor, variable capacitor). The first conductive portion 14 is electrically coupled to a circuit (not shown) fabricated on the substrate of the MEMS device 10. The second conductive portion 16 is not electrically coupled, but is movable via a linear actuator (not shown) that does not require direct connections to electrodes on the movable dielectric sheet 18. The varying amount or degree of overlap of the second conductive portion 16 over the first conductive portion 14 varies the component value of the passive electrical component.

In the example of FIG. 1, the variable passive component is a variable inductor. However, other variable passive components (e.g., variable capacitors) can be formed in accordance with the present invention. The first conductive portion 14 is a first planar inductor fabricated on the substrate 12 of the MEMS device 10, while the second conductive portion 16 is a second planar inductor fabricated onto the movable dielectric plate or sheet 18. The first planar inductor 14 is electrically coupled to a circuit (not shown) fabricated on the MEMS device 10, while no direct electrical coupling is required for the second planar inductor 16. The second planar inductor 16 has both ends shorted together. The varying inductance is achieved over wide ranges through mechanical motion in the plane of the substrate surface by changing the magnetic coupling between the first planar inductor 14 on the substrate 12, and the shorted second planar Inductor 16 on the moving dielectric plate 18.

The shorted second planar inductor 16 slides over the first planar inductor 14 with only a small gap perpendicular to the surface of the substrate 12 and the plane in which the dielectric plate 18 moves. When the shorted second planar inductor 16 is positioned directly over the first planar inductor 14 on the substrate 12, the magnetic coupling is nearly perfect and the first planar inductor 14 has essentially zero inductance due to the shorting of the second planar inductor 16. When the shorted second planar inductor 16 is moved away to completely uncover the first planar inductor 14, the first planar inductor 14 has its own self inductance. At varying amounts or degrees of overlap of the two inductors, varying inductances are achieved in the first planar inductor 14.

Figure 2:
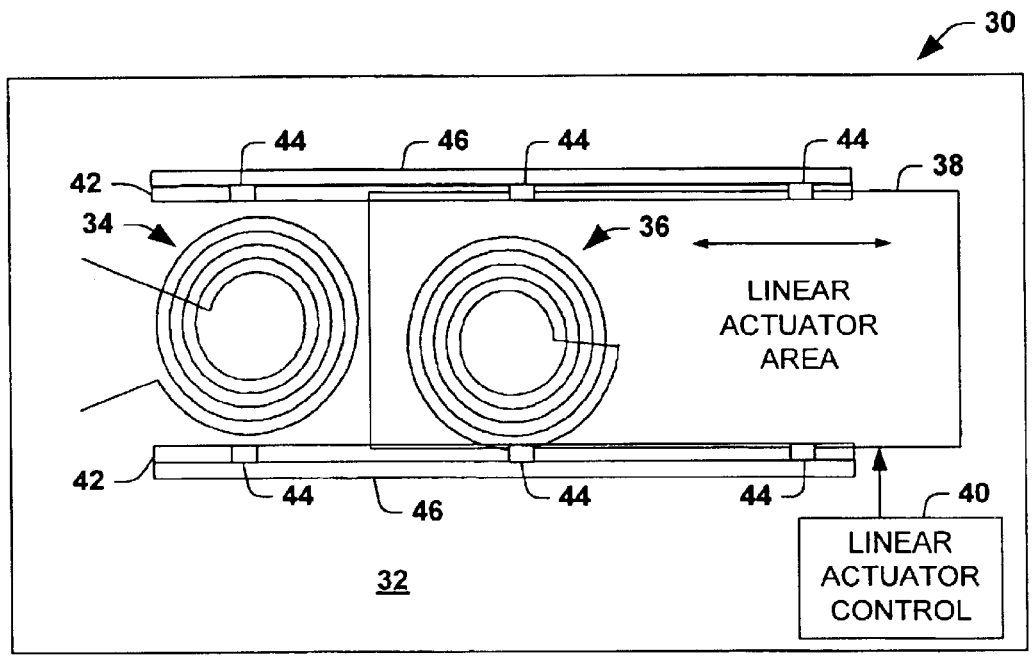
FIG. 2 illustrates a top view of a variable inductor structure fabricated on a MEMS device in accordance with an aspect of the present invention.

FIG. 2 illustrates a top view of a variable inductor structure fabricated on a MEMS device 30 in accordance with an aspect of the present invention. A sliding dielectric plate or sheet 38 resides on rails 42, with keeper tabs 44 over its edges to prevent it from leaving the rails 42 and walls 46 to hold the keeper tabs 44 and retain the linear motion of the sliding dielectric plate 38. A shorted planar inductor 36 is printed or fabricated onto a first end of the sliding dielectric plate 38. A second end of the sliding dielectric plate 38 includes a linear actuator area in which a variety of different linear actuator types can be employed. A linear actuator control component 40 controls the movement of the sliding dielectric plate 38 via a linear actuator. The linear actuator control component 40 can be coupled to interface with one or more device pins and/or ports to control the settings of the linear actuator control component 40 and, thus the position of the sliding dielectric plate 38.

A substrate inductor 34 is printed or fabricated on a substrate 32 of the MEMS device 30. The substrate inductor 34 includes two connecting terminals available for connection to a circuit. The effective inductance value (LEFF) of the substrate inductor 34 depends on the amount or degree of coupling 0<K<1 between the substrate inductor 34 and the movable inductor 36. For example, assuming pure inductances and a perfect short for the movable inductor 36, LEFF can be calculated as follows:

$$M = K * sqrt(LA*LB) \quad \text{EQ. 1}$$

$$V_A = LA * dl_A/dt + M * dl_B/dt \quad \text{EQ. 2}$$

$$V_B = M * dl_A/dt + LB * dl_B/dt = 0 \text{ (Due to short)} \quad \text{EQ. 3}$$

$$dl_B/dt = -M/L_B * dl_A/dt \quad \text{EQ. 4}$$

$$V_A = (L_A - M^2/L_B) * dl_A/dt \quad \text{EQ. 5}$$

$$L_{EFF} = V_A/(dl_A/dt) = LA - M^2/L_B = L_A - K^2 L_A = (1-K^2) * L_A \quad \text{EQ. 6}$$

where M is the definition of mutual inductance, K is the coupling coefficient, $I_A$ and $V_A$ are the current and terminal voltage on substrate inductor 34, and $I_B$ and $V_B$ are current and voltage on the movable inductor 36. Therefore, the effective value $L_{EFF}$ of the inductor combination is $(1-K^2)$ times the self inductance of the substrate inductor 34 by itself. Since K can vary from 0 to 1 depending on the overlap, the variable inductance can vary from 0 to $L_A$.

Figure 3:
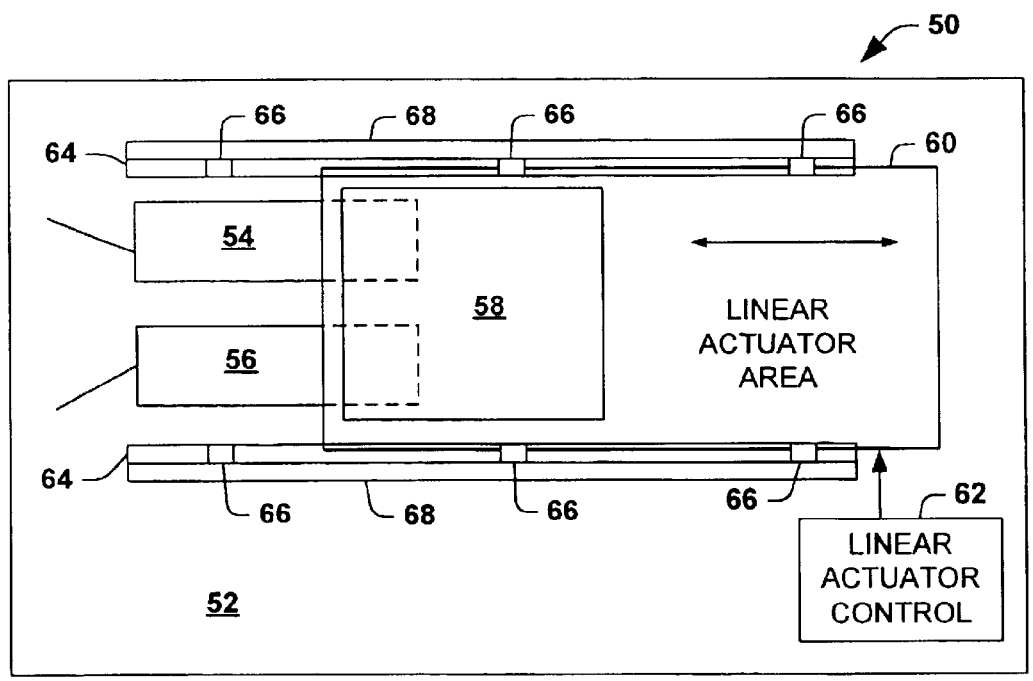
FIG. 3 illustrates a top view of a variable capacitor structure fabricated on a MEMS device in accordance with an aspect of the present invention.

FIG. 3 illustrates a top view of a variable capacitor structure fabricated on a MEMS device 50 in accordance with an aspect of the present invention. A sliding dielectric plate or sheet 60 resides on rails 64, with keeper tabs 66 over its edges to prevent it from leaving the rails 64 and walls 68 to hold the keeper tabs 66 and retain the linear motion of the sliding dielectric plate 60. A movable capacitor pad 58 is printed or fabricated onto a first end of the sliding dielectric plate 60. A second end of the sliding dielectric plate 60 includes a linear actuator area in which a variety of different linear actuator types can be employed. A linear actuator control component 62 controls the movement of the sliding dielectric plate 60 via a linear actuator. The linear actuator control component 62 can be coupled to interface with one or more device pins and/or ports to control the settings of the linear actuator control component 62 and, thus the position of the sliding dielectric plate 60.

A first substrate capacitor pad 54 and a second substrate capacitor pad 56 adjacent to the first substrate capacitor pad 54 are fabricated or printed on a generally planar top surface of a substrate 52. The movable capacitor pad 58 is movable in a plane that is generally parallel to the top surface of the substrate with a gap maintained between the first and second substrate capacitor pads 54 and 56 and the movable capacitor pad 58. The movable capacitor pad 58 has a surface area that overlaps the first substrate capacitor pad 54 and the second substrate capacitor pad 56 to form a first capacitor from the first substrate capacitor pad 54 to the movable capacitor pad 58 and a second capacitor from the second substrate capacitor pad 56 to the movable capacitor pad 58. The first capacitor and the second capacitor are coupled in series via the common movable capacitor pad 58 to provide an effective capacitance $C_{EFF}$. The effective capacitance $C_{EFF}$ is varied based on the area of the plates defining the area of the electric field between the pads. The amount or degree of overlap of the movable capacitor pad 58 over the first substrate capacitor pad 54 and the second substrate capacitor pad 56 determines the effective capacitance CEFF such that:

$$C_{EFF} = (\epsilon_0 * A_1/D)(\epsilon_0 * A_2/D)/(\epsilon_0 * A_1/D + \epsilon_0 * A_2/D) \quad \text{EQ. 7}$$

where $A_1$ is the area of the capacitor plates formed between the overlapping portions of the first substrate capacitor pad 54 and the movable capacitor pad 58, $A_2$ is the area of the capacitor plates formed between the overlapping portions of the second substrate capacitor pad 56 and the movable capacitor pad 58, D is the distance between the capacitor plates and $\epsilon_0$ is the dielectric constant of the insulator (e.g., air) between the plates. Capacitance is minimum when the movable pad 58 uncovers the substrate pads 54 and 56, and maximum when it fully covers them. The capacitance change is large because the gap between the substrate pads 54 and 56 and the movable capacitor pad 58 is small compared to the dimensions and separation of the substrate pads 54 and 56.

Figure 4:
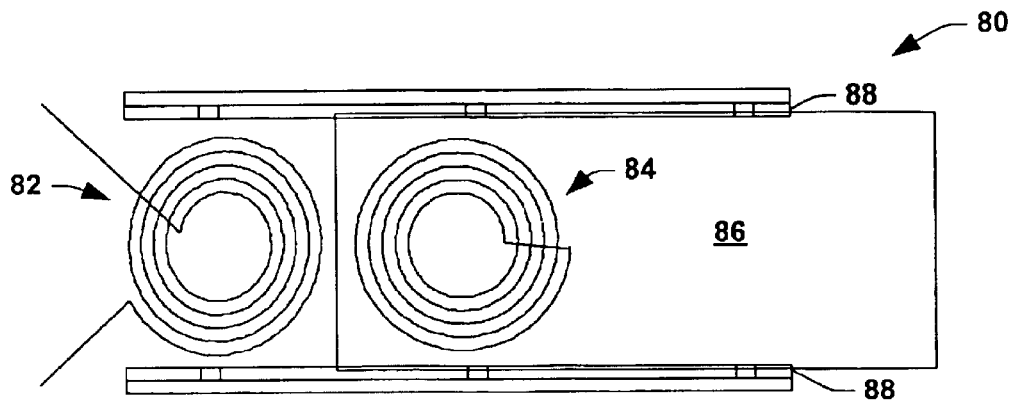
FIG. 4 illustrates a top view of a variable inductor with a movable inductor positioned away from a substrate inductor in accordance with an aspect of the present invention.
Figure 5:
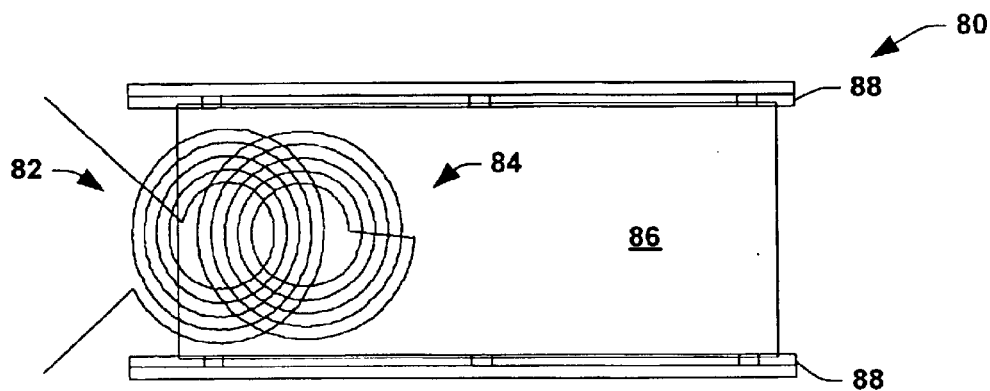
FIG. 5 illustrates a top view of the variable inductor with the movable inductor partially overlapping the substrate inductor in accordance with an aspect of the present invention.
Figure 6:
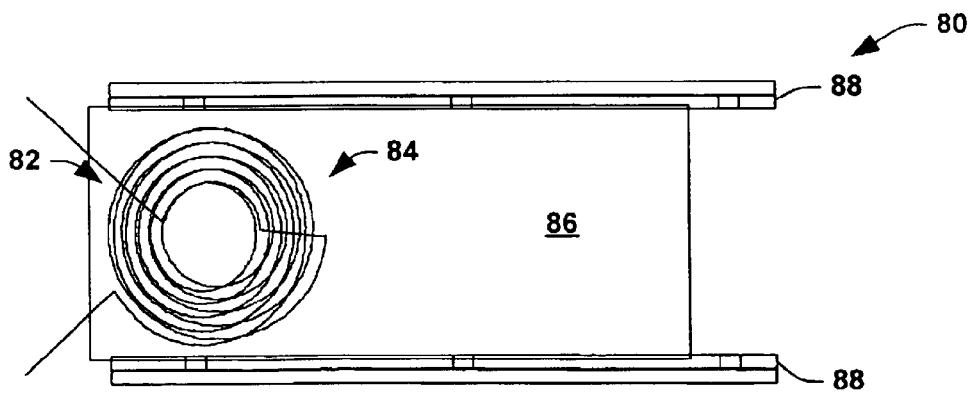
FIG. 6 illustrates a top view of the variable inductor with the movable inductor substantially overlapping the substrate inductor in accordance with an aspect of the present invention.

FIGS. 4–6 illustrate a top view of a variable inductor 80 comprised of a substrate inductor 82 and a movable inductor 84 disposed on a movable dielectric plate 86. The movable dielectric plate 86 is operative to move along rails 88 to place the movable inductor 84 at different overlapping positions with respect to the substrate inductor 82. In FIG. 4, the movable inductor 86 is positioned away from the substrate inductor 82, so the inductance is maximum, such that the effective inductance is equal to the inductance of the substrate inductor (e.g., $L_{EFF}=L_A$). In FIG. 5, the movable inductor 84 is positioned so that the inductors partially overlap, giving a value of K somewhere between 0 and 1, so that the effective inductance $L_{EFF}$ is between the inductance of the substrate inductor 82 and zero inductance. In FIG. 6, the movable inductor 84 is positioned to substantially overlap the substrate inductor 82, so that K is approximately equal to 1 and the effective inductance $L_{EFF}$ is very low. It is to be appreciated that several overlapping position configurations can be employed to provide several effective inductance values. For example, a wide range of values (e.g., 10:1, 20:1) can be obtained by precise control of intermediate values and adjustment in small increments.

Figure 7:
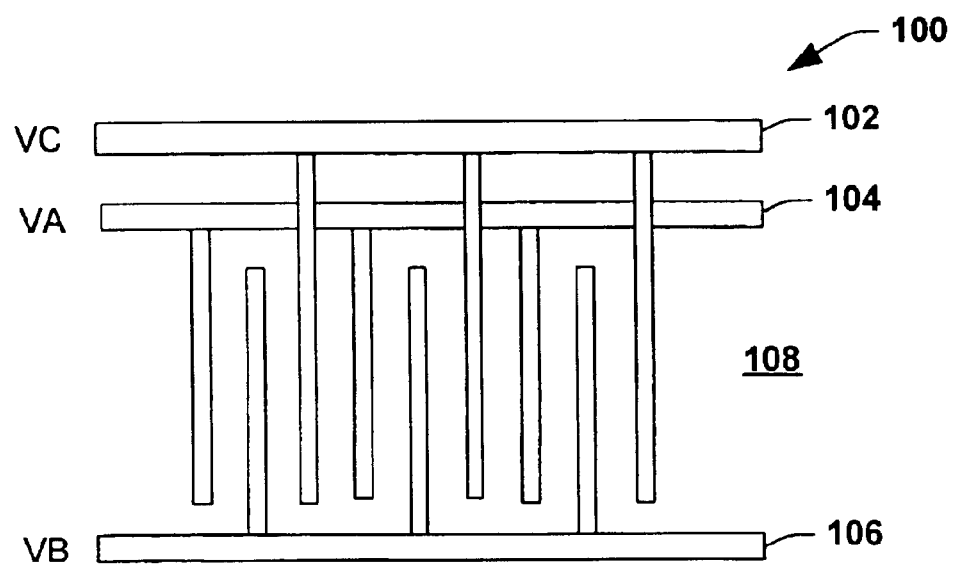
FIG. 7 illustrates a series of adjacent conductive strips that form a first portion of a three-phase linear actuator in accordance with an aspect of the present invention.
Figure 8:
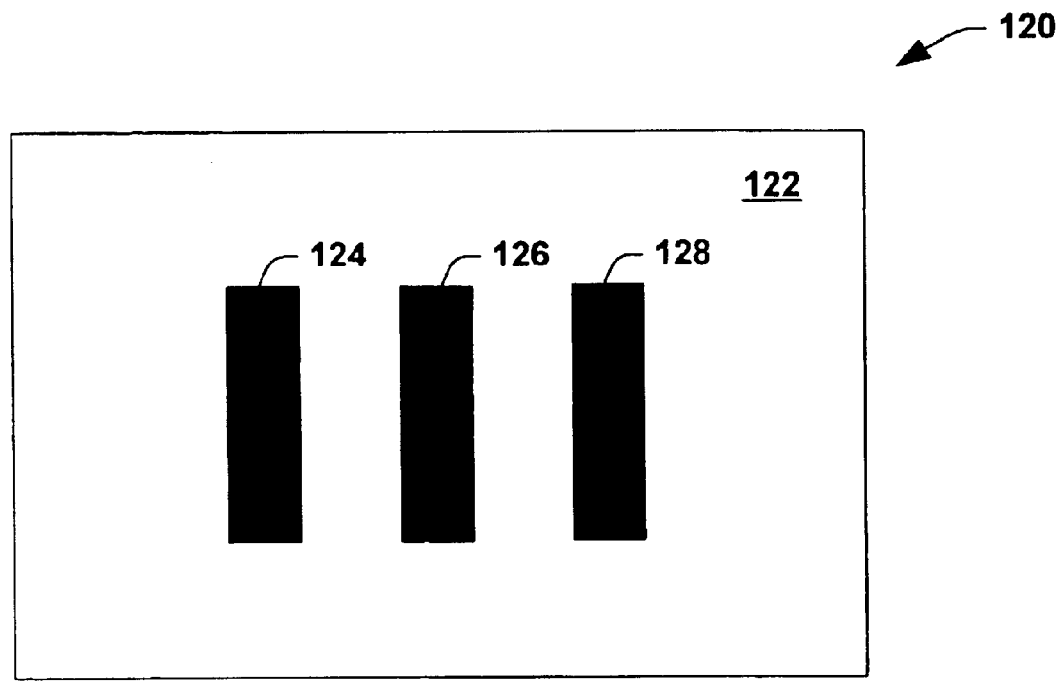
FIG. 8 illustrates an electrode pattern of a dielectric region of a dielectric plate that form a second portion of the three-phase linear actuator in accordance with an aspect of the present invention.

It is to be appreciated that a variety of different linear actuator devices can be employed to move the dielectric plate between various overlapping positions to vary the component value of the variable passive component without employing direct electrical connections to the movable dielectric plate. FIGS. 7–8 illustrate the components associated with a 3-phase electrostatic stepping actuator in accordance with an aspect of the present invention.

FIG. 7 illustrates a series of adjacent conductive strips formed on a substrate 108 that provides the actuating electrodes to generate the electrostatic actuation of the linear actuator. A first electrode 106 is illustrated as having a longitudinal conductive strip coupled to a first voltage source VB and being disposed on a bottom of the series of actuating electrodes. A plurality of conductive strips extend upwardly and generally perpendicular to the longitudinal strip of the first electrode 106. A second electrode 104 is illustrated as having a longitudinal conductive strip coupled to a second voltage source VA and being disposed above the first electrode 106. A plurality of conductive strips extend downwardly and generally perpendicular to the longitudinal strip of the second electrode 104. A third electrode 102 is illustrated as having a longitudinal conductive strip coupled to a third voltage source VC and being disposed above the first electrode 106 and second electrode 104, such that the third electrode crosses over the second electrode 104 without contact. A plurality of conductive strips extend downwardly and generally perpendicular to the longitudinal strip of the third electrode 102, such that the strips do not make contact with the second or first electrodes 104 and 106, respectively.

The plurality of conductive strips from the first, second and third electrodes 106, 104 and 102, respectively, are spaced apart from each other in an equidistant relationship, such that a strip of the second electrode 104 is disposed adjacent, parallel and in a spaced apart relationship from a strip of the first electrode 106. A strip of the third electrode 102 is disposed adjacent, parallel and in a spaced apart relationship from a strip of the second electrode 104, and then a strip of the first electrode 106 is disposed adjacent, parallel and in a spaced apart relationship from a strip of the third electrode 102 in a repeating manner. The electrostatic actuators are connected so that they can be biased by three independent voltages VA, VB, and VC. The voltages of the three independent voltages are varied between a voltage state, a ground state and a floating state.

FIG. 8 illustrates a linear actuator area of a dielectric plate 120 such as that illustrated in FIGS. 1–6. The dielectric plate 120 includes a dielectric region 122 with a first electrode pattern 124, a second electrode pattern 126 and a third electrode pattern 128. The second electrode pattern 126 is disposed adjacent, parallel and in a spaced apart relationship from the first electrode 124, and the third electrode pattern 128 is disposed adjacent, parallel and in a spaced apart relationship from the second electrode pattern 126. The electrodes 102, 104 and 106 fabricated onto the substrate 108 interact with the electrodes 124, 126 and 128 fabricated onto the dielectric region 122 to move the dielectric plate 120 linearly so that the conductive portions on the dielectric region 122 can be moved between a plurality of overlapping positions to vary the component value of the variable component.

Figure 9:
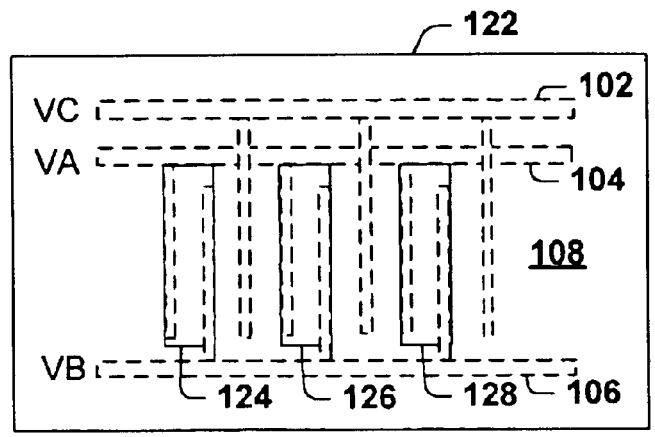
FIG. 9 illustrates the three-phase linear actuator with the dielectric region in a first position in accordance with an aspect of the present invention.
Figure 10:
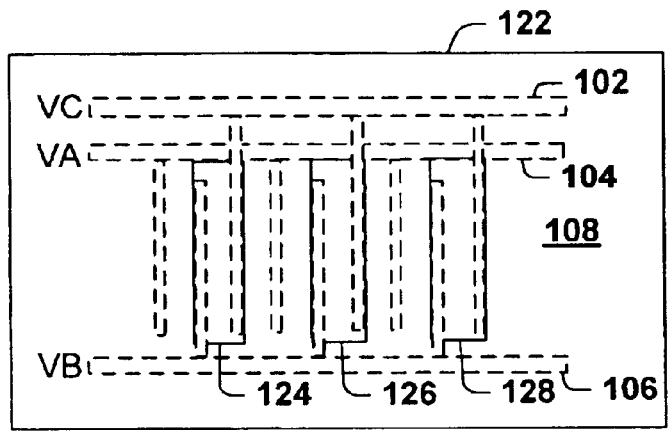
FIG. 10 illustrates the three-phase linear actuator with the dielectric region in a second position in accordance with an aspect of the present invention.
Figure 11:
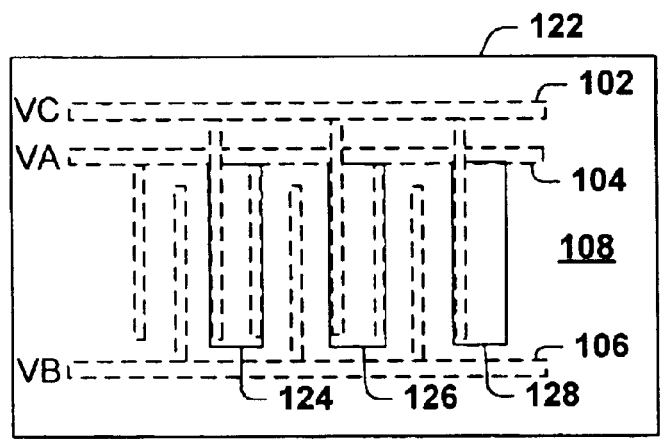
FIG. 11 illustrates the three-phase linear actuator with the dielectric region in a third position in accordance with an aspect of the present invention.

FIGS. 9–11 illustrate the three phase motion associated with the three phase linear actuator illustrated in FIGS. 7–8. The dielectric region 122 is illustrated as residing above the electrodes 102, 104 and 106 fabricated on the substrate 108. In FIG. 9, VA is biased at 20 volts, VB is biased at 0 volts and VC is floated. The movable dielectric region 122 will position itself so that the dielectric plate electrodes 124, 126 and 128 will cover the substrate strips which have the potential difference, which are the strips of the first electrode 106 and the strips of the second electrode 104. Therefore, the dielectric region 122 will move so that the dielectric electrodes 124, 126 and 128 cover the adjacent VA and VB strips on the substrate 108, minimizing the electrostatic field energy. By biasing or letting float the three electrodes on the substrate 108 in a sequential pattern, the dielectric plate can be made to move to the right and/or left.

In FIG. 10, VA is floated, VB is biased at 20 volts and VC is biased at 0 volts. The movable dielectric region 122 will position itself so that the dielectric plate electrodes 124, 126 and 128 will cover the substrate strips which have the potential difference, which is the strips of the second electrode 104 and the strips of the third electrode 102. In FIG. 11, VA is biased to 0 volts, VB is floated and VC is biased at 20 volts. The movable dielectric region 122 will position itself so that the dielectric plate electrodes 124,126 and 128 will cover the substrate strips which have the potential difference, which are the strips of the third electrode 102 and the strips of the first electrode 106.

Figure 12:
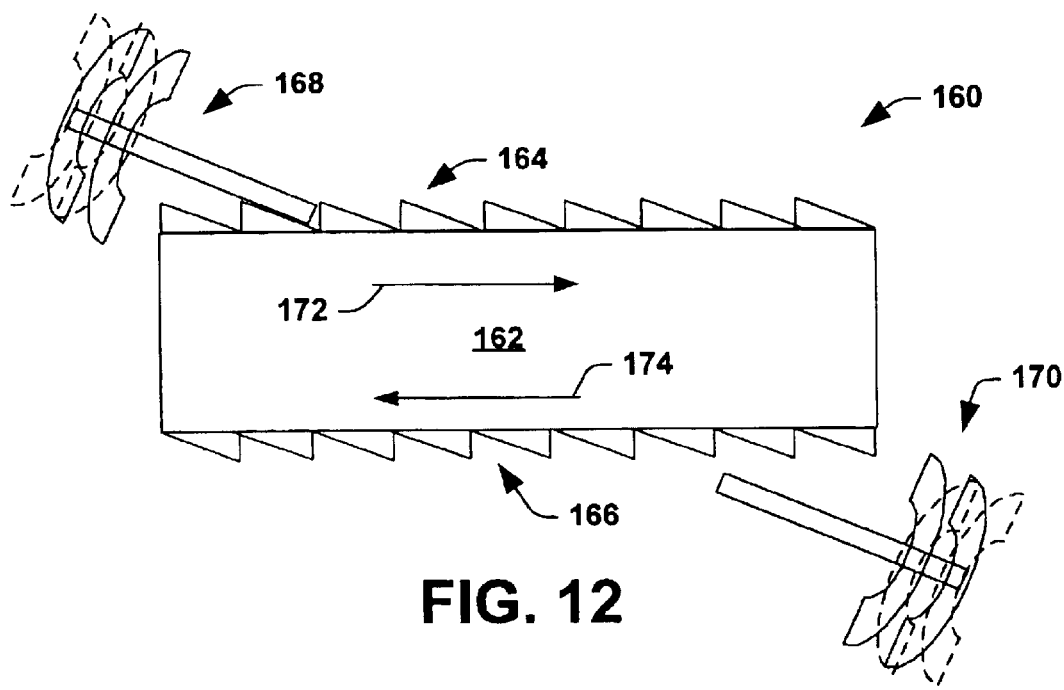
FIG. 12 illustrates an exemplary pushrod and tooth linear actuator system in accordance with an aspect of the present invention.

FIG. 12 illustrates an exemplary pushrod and tooth linear actuator system 160 in accordance with an aspect of the present invention. The pushrod and tooth linear actuator system 160 employs a pushrod with flexible air bridges or beams which are bent to the left or right by electrostatic force. A dielectric plate 162 includes a first longitudinal edge having a plurality of teeth 164 angled to interface with a first pushrod and beam device 168 and a second longitudinal edge having a plurality of teeth 166 angled to interface with a second pushrod and beam device 170. The first pushrod and beam device 168 is operative to interface with the plurality of teeth 164 to move the dielectric plate 162 in a first direction indicated by an arrow 172 and the second pushrod and beam device 170 is operative to interface with the plurality of teeth 166 to move the dielectric plate 162 in a second direction indicated by an arrow 174 in an opposite direction with respect to the first direction.

During movement of the dielectric plate 162 in the first direction, the second pushrod and beam device 170 is disengaged from the plurality of teeth 166 and the first pushrod and beam device 168 is engaged with the plurality of teeth 164. Two beams or air bridges are shown working together to move the pushrod of the pushrod and beam device 168, however the movement could be accomplished by one, two, or many beams depending on how much force is needed. When the beams or air bridges are flexed toward the pushrod, the pushrod moves the dielectric plate 162 in the first direction. When the beams or air bridges are flexed away from the pushrod of the pushrod and beam device 168, the pushrod is moved back to engage the next tooth. The cycle of sequentially pushing, and then releasing the teeth moves the dielectric plate 162 in the first direction. During movement of the dielectric plate 162 in the second direction, the first pushrod and beam device 168 is disengaged from the plurality of teeth 164 and the second pushrod and beam device 170 is engaged with the plurality of teeth 166. The cycle of sequentially pushing, and then releasing the plurality of teeth 166 employing the second pushrod and beam device 170 operates in a similar manner as the first pushrod and beam device 168 to move the dielectric plate 162 in the second direction.

Figure 13:
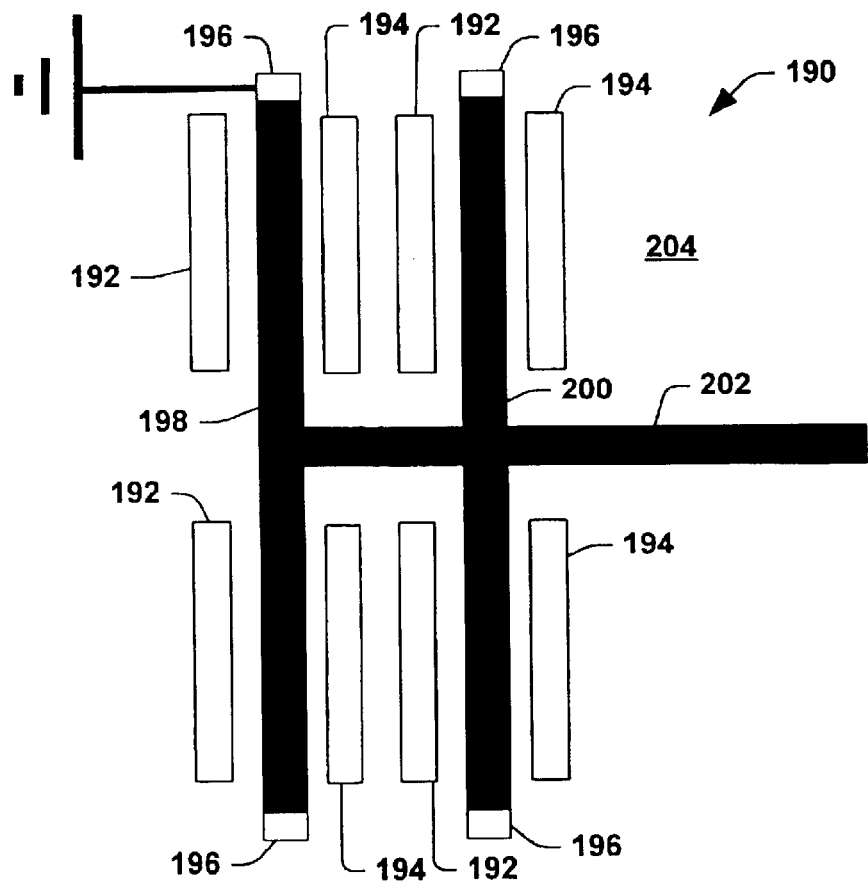
FIG. 13 illustrates a top view of a pushrod and beam device in accordance with an aspect of the present invention.

FIG. 13 illustrates a top view of a pushrod and beam device 190 and associated substrate electrodes in accordance with an aspect of the present invention. The pushrod and beam device 190 includes a pushrod 202 coupled to a first beam 198 and a second beam 200. The pushrod 202 is generally perpendicular to the first beam 198 and the second beam 200. The first beam 198 and the second beam 200 are disposed slightly above a substrate 204 employing associated anchors 196. At least one of the anchors 196 are coupled to ground such that the beams 198 and 200 and the anchors 196 are held in a ground state. A plurality of right control pads or electrodes 194 and a plurality of left control pads or electrodes 192 are fabricated on the substrate 204 below the first beam 198 and the second beam 200. When the left control pads 192 are activated and the right control pads 194 are deactivated, an electrostatic force between the left control pad 192 and the grounded beams 198 and 200 flexes the beams 198 and 200 to the left and, thus moves the pushrod 202 to the left. When the right control pads 194 are activated and the left control pads 192 are deactivated, an electrostatic force between the right control pads 194 and the grounded beams 198 and 200 flexes the beams 198 and 200 to the right and, thus moves the pushrod 202 to the right.

The variable passive components of the present invention are particularly useful in adjustable filters and matching circuits and can replace a whole set of fixed components, and for adaptive circuits which automatically optimize internal matching under real-time computer control. Both uses have widespread application in all kinds of receivers, for instance, to minimize noise and interference. Additionally, the variable passive components can be used in adjustments for multi-band transceivers such as cell phones. A tunable filter can replace a bank of switched fixed filters, and a tunable matching circuit can optimize system performance in real time for a particular signal situation.

Figure 14:
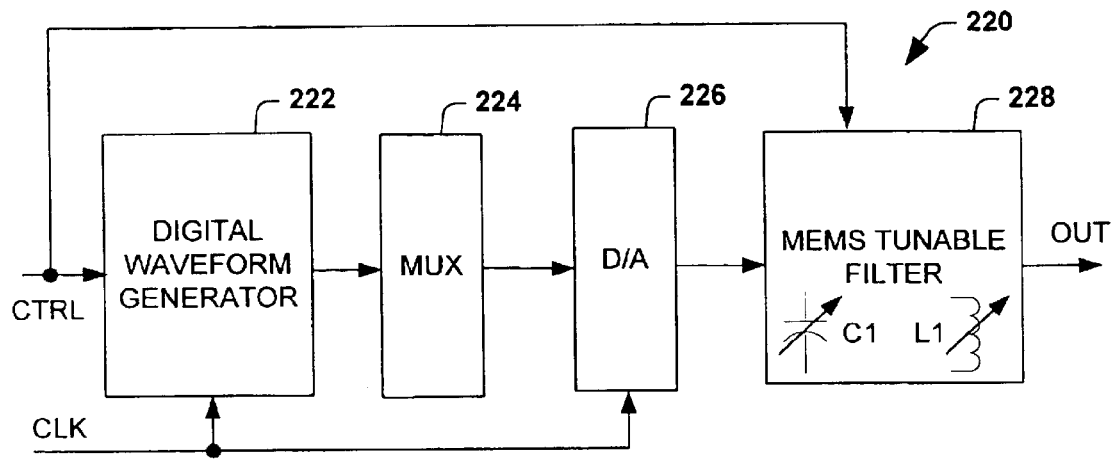
FIG. 14 illustrates a MEMS tunable filter employed in a digital synthesizer in accordance with an aspect of the present invention.

FIG. 14 illustrates a MEMS tunable filter 228 employed in a digital synthesizer 220 in accordance with an aspect of the present invention. The MEMS tunable filter 228 includes both a tunable capacitor C1 and a tunable inductor L1. The tunable capacitor C1 is similar to the tunable capacitor of FIG. 3 and includes an overlapping plate on a movable dielectric that includes varying degrees of overlap of two adjacent capacitor pads disposed on a substrate to vary the capacitance of the tunable capacitor. The tunable inductor L1 is similar to the tunable inductor of FIG. 2 and includes an overlapping shorted inductor disposed on a movable dielectric that includes varying degrees of overlap of a substrate inductor to vary the inductance of the tunable inductor. The MEMS tunable filter 228 can include a plurality of adjustable inductors and/or capacitors to provide adjustable filter control of various frequencies and bandwidths. Alternatively, the filter 228 can include one or more tunable capacitors or one or more tunable inductors to provide a tunable filter.

The synthesizer 220 includes a digital waveform generator 222 coupled to a multiplexer 224, which is coupled to a digital-to-analog (D/A) converter 226. The output of the D/A converter 226 is coupled to the MEMS tunable filter 228. A control signal is coupled to the digital waveform generator 222 and the MEMS tunable filter 228, while a clock signal is coupled to the digital waveform generator 222 and the D/A converter 226. The digital waveform generator 222 provides certain frequency waveforms based on the control signal. The MEMS tunable filter 228 is then adjusted based on the control signal to pass only the specific desired frequency or tone. The different tone can be selected based on the control signal which causes the digital waveform generator 222 and the MEMS tunable filter 228 to adjust to generate and purify the newly selected tone.

Figure 15:
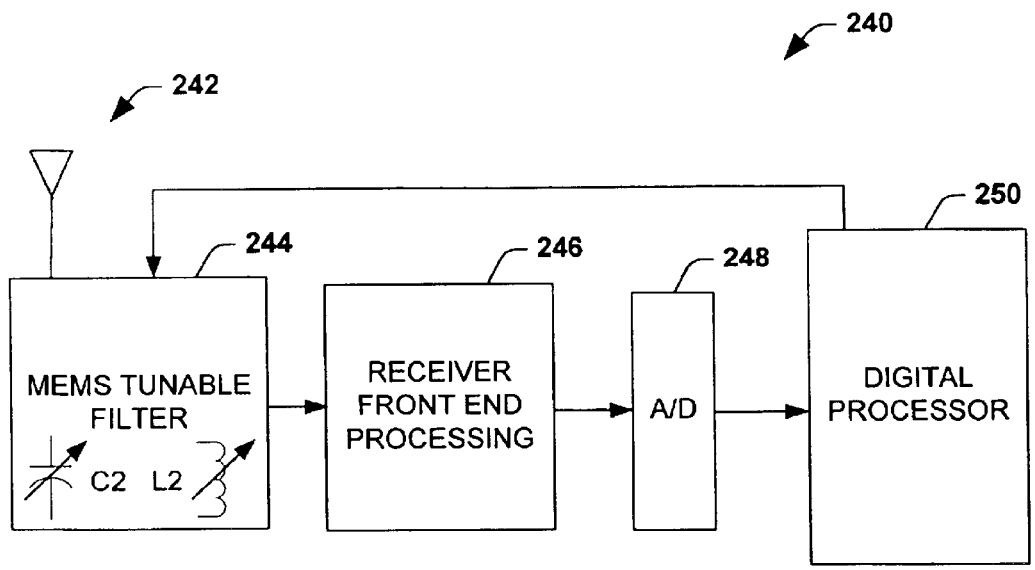
FIG. 15 illustrates a MEMS tunable filter employed in a receiver in accordance with an aspect of the present invention.

FIG. 15 illustrates a MEMS tunable filter 244 employed in a receiver 240 in accordance with an aspect of the present invention. The MEMS tunable filter 244 includes both a tunable capacitor C2 and a tunable inductor L2. The tunable capacitor C2 is similar to the tunable capacitor of FIG. 3, and includes an overlapping plate on a movable dielectric that includes varying degrees of overlap of two adjacent capacitor pads disposed on a substrate to vary the capacitance of the tunable capacitor. The tunable inductor L2 is similar to the tunable inductor of FIG. 2, and includes an overlapping shorted inductor disposed on a movable dielectric that includes varying degrees of overlap of a substrate inductor to vary the inductance of the tunable inductor. As previously stated, the MEMS tunable filter 244 can include a plurality of adjustable inductors and/or capacitors to provide adjustable filter control of various frequencies and bandwidths. Alternatively, the filter 244 can include only one of one or more tunable capacitors or one or more tunable inductors to provide a tunable filter.

The MEMS tunable filter 244 is coupled to an antenna 242 that is operative to receive a radio signal. The MEMS tunable filter 244 filters the received radio signal and provides it to a receiver front end processing component 246. The MEMS tunable filter 244 filters out unwanted signals such as interfering and/or jamming signals. The front end processing component 246 then processes the received radio signal which can include, for example, amplifying the received radio signal to a desired amplitude. The processed signal is then provided to an analog-to-digital (A/D) converter 248 to convert the analog filtered radio signal to digital data. The digital data is then further processed by a digital processor 250. The MEMS tunable filter 244 can be employed to tune in a desired narrow frequency band and to tune out interfering and jamming signals. Additionally, the MEMS tunable filter 244 can be employed to adjust the frequency (e.g., frequency hopping) and bandwidth (e.g., wide band applications) of the receiver 240 discretely or continuously to obtain a desired result.

Figure 16:
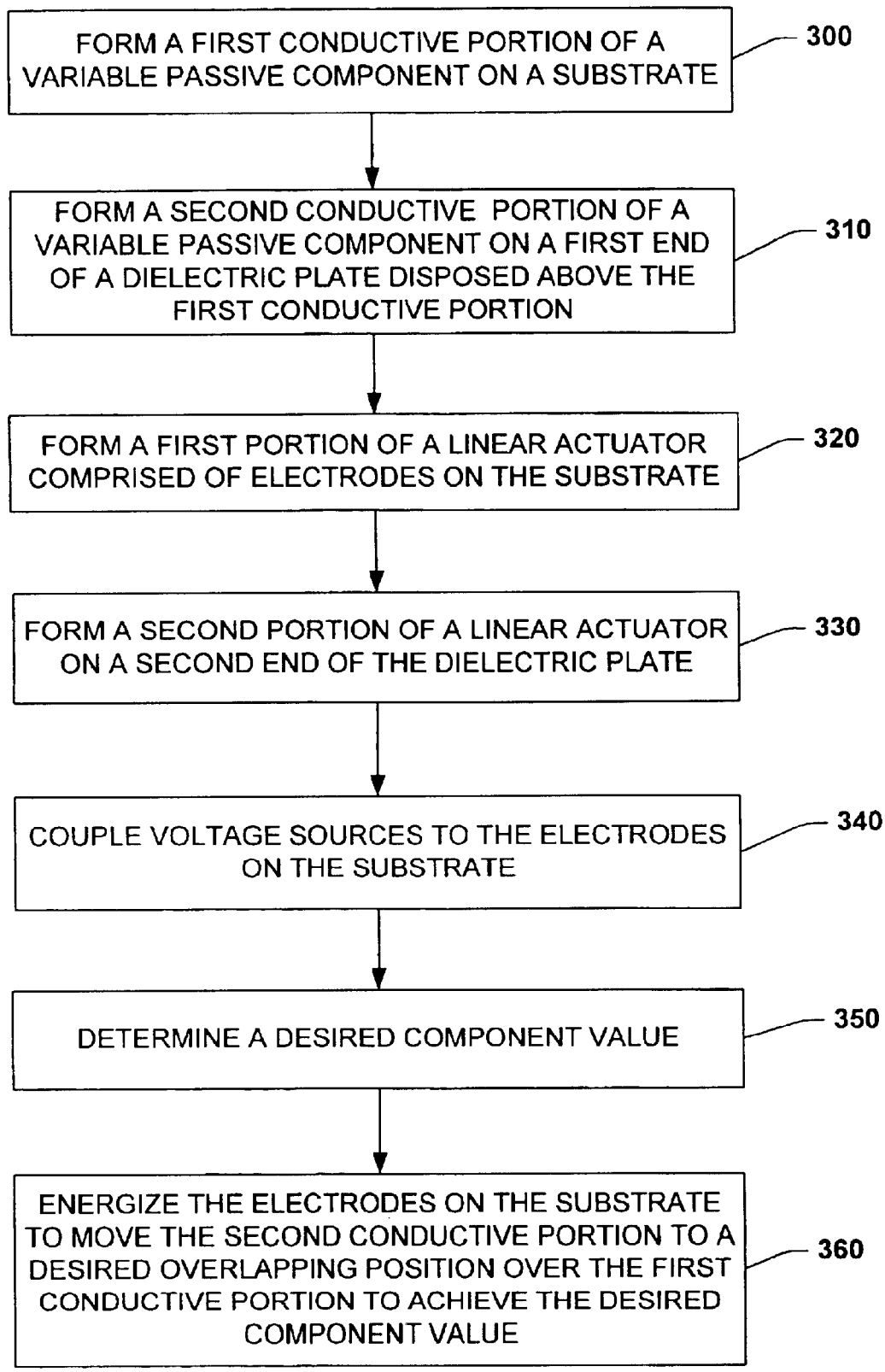
FIG. 16 illustrates a methodology for providing a variable passive component on a MEMS device in accordance with an aspect of the present invention.

In view of the foregoing structural and functional features described above, a methodology in accordance with various aspects of the present invention will be better appreciated with reference to FIG. 16. While, for purposes of simplicity of explanation, the methodology of FIG. 16 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 16 illustrates a methodology for providing a variable passive component on a MEMS device in accordance with an aspect of the present invention. The methodology begins at 300 where a first conductive portion of a variable passive component is formed on a generally planar top surface of a substrate. At 310, a second conductive portion is formed on a first end of a dielectric plate. The dielectric plate is disposed such that the second conductive portion can be moved at different overlapping positions with respect to the first conductive portion with a gap maintained between the first and second conductive portions. The dielectric plate moves in a plane that is generally parallel to the top surface of the substrate, but could have perpendicular components associated with the movement thereof. The passive electrical component can be a variable inductor with the first conductive portion being an inductor fabricated onto the substrate and the second conductive portion being a shorted inductor fabricated on the dielectric plate, such that different overlapping positions of the shorted inductor can vary the inductance of the inductor fabricated onto the substrate. Alternatively, the passive electrical component can be a variable capacitor with the first conductive portion being a pair of adjacent conductive pads disposed on the substrate and the second conductive portion being a large overlapping capacitor pad such that different overlapping positions of the overlapping capacitor pad over the adjacent conductive pads varies the capacitance of the variable capacitor. In the case of the inductor, interaction is provided by magnetic fields, and in the case of the capacitor, interaction is provided by electric fields.

The methodology the proceeds to 320 where a first portion of a linear actuator comprised of electrodes are formed on the substrate. At 330, a second portion of the linear actuator is formed on a second end of the dielectric plate. For example, the linear actuator can be a 3-phase stepper actuator with the second portion of the linear actuator being electrodes formed on the dielectric plate and the first portion of the linear actuator being electrodes formed on the substrate similar to that illustrated in FIGS. 7–11. Alternatively, the linear actuator can be a pushrod actuator such that the second portion is tooth shaped edges and the first portion is a pushrod actuator device formed on the substrate and coupled to the tooth shaped edges as illustrated in FIGS. 12–13. In these and other cases, no direct connections are needed to any electrodes on the movable dielectric sheet. This eliminates the problem of making connection to a moving part. It is to be appreciated that in an actual fabrication, the substrate components would be formed concurrently, while the dielectric plate components would be formed concurrently, and most likely after the formation of the substrate components.

At 340, voltage sources are coupled to the electrodes formed on the substrate. At 350, a desired component value is determined for the variable passive component. The methodology then proceeds to 360. At 360, the electrodes formed on the substrate are energized in a configuration that moves the second conductive portion to a desired overlapping position over the first conductive portion to achieve the desired component value. For example, in the 3-phase stepper actuator, the electrodes can be activated in an alternating fashion between voltage, ground and a floating state to move the second conductive portion to a desired overlapping position. In a push rod actuator, the electrodes are activated to bend the suspended actuator beam from the left position to the right position, and from the right position to the left position to provide a sequential pushing and releasing that moves the dielectric plate to a desired overlapping position.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A variable passive component comprising:
a first conductive portion disposed on a substrate having a generally planar top surface; and
a second conductive portion disposed on a plate that is movable in a plane that is generally parallel to the top surface of the substrate, such that a gap is maintained between the second conductive portion and the first conductive portion, in which the overlap of the second conductive portion with respect to first conductive portion varies a component value of the variable passive component.

2. The component of claim 1, the variable passive component being an inductor.

3. The component of claim 2, the first conductive portion being a first inductor coupled to a circuit and the second conductive portion being a second inductor with shorted ends.

4. The component of claim 3, the effective inductance of the variable inductor being based on the amount of overlap of the second inductor over the first inductor, the amount of overlap of the second inductor with respect to the first inductor varying the magnetic coupling between the first inductor and the second inductor.

5. The component of claim 1, the variable passive component being a variable capacitor.

6. The component of claim 5, the first conductive portion being a first substrate capacitor pad and a second substrate capacitor pad and the second conductive portion being a movable capacitor pad that overlaps the first substrate capacitor pad and the second substrate capacitor pad, the first substrate capacitor pad and the movable capacitor pad forming a first capacitor and the second substrate capacitor pad and the movable capacitor pad forming a second capacitor that is in series with the first capacitor, in which the amount of overlap of the movable capacitor pad with respect to the first and second capacitor pads varies the area of the electric field between the movable capacitor pad and the first and second capacitor pads and the capacitance of the variable capacitor.

7. The component of claim 1, further comprising means for moving the dielectric plate between a plurality of overlapping positions.

8. The component of claim 1, further comprising a linear actuator operative to move the dielectric plate between a plurality of overlapping positions, such that no direct connections are necessary to any electrodes on the movable dielectric sheet.

9. The component of claim 8, the linear actuator being a three-phase stepper actuator.

10. The component of claim 8, the linear actuator being a pushrod and tooth linear actuator system.

11. A microelectromechanical system (MEMS) device comprising the component of claim 1.

12. A tunable filter comprising the MEMS device of claim 10.

13. A variable passive component comprising:
a first inductor formed on a substrate having a generally planar top surface;
a second inductor formed on a plate that is movable along a plane that is generally parallel to the top surface, such that a gap is maintained between the second inductor and the first inductor; and
a linear actuator that moves the plate between a plurality of positions to vary an overlap of the second inductor with respect to the first inductor, the effective inductance of the first inductor being based on the amount of overlap of the second inductor over the first inductor.

14. The variable passive component of claim 13, the effective inductance being substantially equal to $(1-K^2)$ the self inductance of the first inductor, where K is the magnetic coupling coefficient of the second inductor with respect to the first inductor.

15. The variable passive component of claim 13, the second inductor having shorted ends.

16. A tunable filter comprising the variable passive component of claim 13.

17. The variable passive component of claim 16, further comprising a plurality of variable inductors having associated substrate inductors and movable plate inductors.

18. The variable passive component of claim 16, further comprising a variable capacitor having an overlapping movable capacitor pad and a pair of adjacent substrate capacitor pads with a gap formed therebetween, the capacitance of the variable capacitor being varied by the amount of overlap of the movable capacitor pad over the pair of adjacent substrate capacitor pads.

19. A variable passive component comprising:
  a first capacitor pad formed on a substrate having a generally planar top surface;
  a second capacitor pad formed on the substrate adjacent the first capacitor pad;
  a movable capacitor pad that is movable in a plane that is generally parallel to the top surface of the substrate, such that a gap is maintained between the movable capacitor pad and the first and second capacitor pads, the first capacitor pad and the movable capacitor pad forming a first capacitor and the second capacitor pad and the movable capacitor pad forming a second capacitor in series with the first capacitor to provide a variable capacitor; and
  a linear actuator that moves the movable capacitor pad between a plurality of positions to vary an overlap of the movable capacitor pad with respect to the first capacitor pad and the second capacitor pad to vary the capacitance of the variable capacitor.

20. The variable passive component of claim 19, further comprising a plurality of variable capacitors having associated substrate capacitor pads and movable capacitor pads.

21. The variable passive component of claim 19, further comprising a variable inductor having a shorted inductor disposed on a movable plate and an inductor formed on the substrate, the inductance of the inductor being varied by the amount of overlap of the shorted inductor over the substrate inductor.

22. A tunable filter comprising the variable passive component of claim 21.

23. A digital synthesizer comprising the tunable filter of claim 22.

24. A receiver comprising the tunable filter of claim 22.

25. A method for providing a variable passive component, the method comprising:
  fabricating a first conductive portion on a generally planar top surface of a substrate; and
  fabricating a second conductive portion on a first end of a plate; and
  disposing the plate such that the plate is movable along a plane generally parallel to the top surface of the substrate to vary an overlap of the second conductive portion with respect to first conductive portion and maintain a gap therebetween, in which the component value of the variable passive component varies based on the amount of overlap of the second conductive portion over the first conductive portion.

26. The method of claim 25, the variable passive component being one of an inductor and a capacitor.

27. The method of claim 25, further comprising determining a desired component value and moving the second conductive portion over the first conductive portion at a desired overlapping position to achieve the desired component value.

28. The method of claim 25, the plate being movable to a plurality of different overlapping positions to provide 20:1 component values.

29. The method of claim 25, the plate being movable to a plurality of different overlapping positions to provide 10:1 component values.

30. The method of claim 25, the dielectric plate being movable via a linear actuator to a plurality of different overlapping positions, such that no direct connections are necessary to any electrodes on the movable plate.

* * * * *